(12) United States Patent
Sauciuc et al.

(10) Patent No.: US 7,633,753 B2
(45) Date of Patent: Dec. 15, 2009

(54) PIEZOELECTRIC AIR JET AUGMENTED COOLING FOR ELECTRONIC DEVICES

(75) Inventors: Ioan Sauciuc, Phoenix, AZ (US); Gregory M. Chrysler, Chandler, AZ (US); Hakan Erturk, Phoeniz, AZ (US)

(73) Assignee: Intel Corporation, Santa Clara, CA (US)

( * ) Notice: Subject to any disclaimer, the term of this patent is extended or adjusted under 35 U.S.C. 154(b) by 249 days.

(21) Appl. No.: 11/862,546

(22) Filed: Sep. 27, 2007

(65) Prior Publication Data

US 2009/0174999 A1 Jul. 9, 2009

(51) Int. Cl.
*H05K 7/20* (2006.01)
(52) U.S. Cl. .................. 361/694; 361/695; 257/721; 174/16.1
(58) Field of Classification Search .............. None
See application file for complete search history.

(56) References Cited

U.S. PATENT DOCUMENTS

| | | | |
|---|---|---|---|
| 4,939,405 A * | 7/1990 | Okuyama et al. | 310/330 |
| 5,542,821 A * | 8/1996 | Dugan | 417/53 |
| 5,914,856 A * | 6/1999 | Morton et al. | 361/690 |
| 6,123,145 A * | 9/2000 | Glezer et al. | 165/104.33 |
| 6,588,497 B1 * | 7/2003 | Glezer et al. | 165/84 |
| 7,248,475 B2 | 7/2007 | Paydar | |
| 7,486,515 B2 * | 2/2009 | Brandenburg et al. | 361/703 |
| 2007/0001550 A1 | 1/2007 | Palanduz et al. | |
| 2008/0137289 A1 * | 6/2008 | Arik et al. | 361/689 |

OTHER PUBLICATIONS

United States Patent Application, pending—not yet published, U.S. Appl. No. 11/694,762, filed Mar. 30, 2007, to Chrysler et al.
United States Patent Application, pending—not yet published, U.S. Appl. No. 11/731,749, filed Mar. 30, 2007, to Leija et al.
United States Patent Application, pending—not yet published, U.S. Appl. No. 11/828,759, filed Jul. 26, 2007, to Erturk et al.
United States Patent Application, pending—not yet published, U.S. Appl. No. 11/646,065, filed Dec. 27, 2006, to Chrysler et al.

* cited by examiner

*Primary Examiner*—Boris L Chervinsky
(74) *Attorney, Agent, or Firm*—David L. Guglielmi

(57) ABSTRACT

In some embodiments, piezoelectric air jet augmented cooling for electronic devices is presented. In this regard, an apparatus is introduced having a plurality of more than about one hundred lead-free piezoelectric layers and electrodes stacked on top of each other and formed around a central opening, and a diaphragm coupled to the piezoelectric layers and substantially covering the central opening to vibrate and blow air when an operating voltage is applied to the electrodes. Other embodiments are also disclosed and claimed.

19 Claims, 2 Drawing Sheets

PIEZOELECTRIC AIR JET AUGMENTED COOLING FOR ELECTRONIC DEVICES

FIELD OF THE INVENTION

Embodiments of the present invention generally relate to the field of electronic device cooling and, more particularly, to piezoelectric air jet augmented cooling for electronic devices.

BACKGROUND OF THE INVENTION

Many electronic devices, for example integrated circuit devices, in computing systems need an active or passive cooling solution to keep from overheating. Cooling solutions, especially for smaller computing systems, are generally constrained in terms of their size and the amount of noise they can produce.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
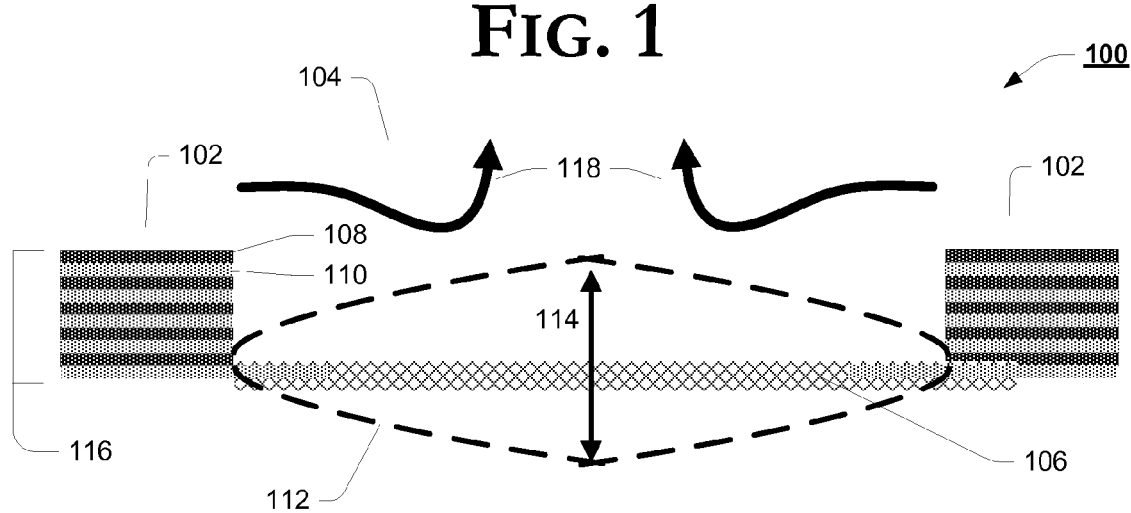
FIG. 1 is a graphical illustration of a cross-sectional view of an example piezoelectric air jet, in accordance with one example embodiment of the invention.

FIG. 1 is a graphical illustration of a cross-sectional view of an example piezoelectric air jet, in accordance with one example embodiment of the invention. As shown, piezoelectric air jet 100 includes one or more of multi-layer piezoelectric stack 102, central opening 104, diaphragm 106, piezoelectric layer 108, electrode layer 110, oscillation region 112, travel distance 114, and thickness 116. In one embodiment, thickness 116 is less than about 1.5 millimeters. Piezoelectric air jet 100 may include additional elements, such as housing, clips, connectors, crystals, or other electronic or mechanical components, which aren't shown for ease of explanation.

Multi-layer piezoelectric stack 102 represents a stack or alternating piezoelectric layers 108 and electrode layers 110. In one embodiment multi-layer piezoelectric stack 102 might comprise dozens of layers. In one embodiment multi-layer piezoelectric stack 102 might comprise of up to several hundred layers. Multi-layer piezoelectric stack 102 may include adhesive between layers and electrical connections between electrodes 110, but these aren't shown for simplicity. Multi-layer piezoelectric stack 102 may be formed completely or partially around central opening 104.

Piezoelectric layer 108 may comprise a lead-free piezoelectric material. In one embodiment, piezoelectric layer 108 comprises $BaTiO_3$. Each piezoelectric layer 108 may be laminated using multilayer ceramic capacitor technology where each layer is between about 1-4 micrometers thick. In one embodiment, electrode 110 comprises nickel which is co-fired with piezoelectric layer 108 for reliable adhesion without the need for glue or epoxy. In one embodiment, electrode 110 is slightly longer than piezoelectric layer 108.

Diaphragm 106 is coupled with multi-layer piezoelectric stack 102 and substantially covers central opening 104. In one embodiment, diaphragm 106 is a flexible polymer made by injection molding a polymer into and/or around central opening 104. When the multi-layer piezoelectric stack 102 is subject to some alternating current at an operating voltage, piezoelectric layer 108 will change its shape resulting in lateral vibration. In one embodiment, the operating voltage is less than about 5 volts. The vibrations in multi-layer piezoelectric stack 102 will cause diaphragm 106 to oscillate within oscillation region 112 with an elongation represented by travel distance 114. In one embodiment, diaphragm 106 oscillates at a resonance frequency of the piezoelectric layers 108. In one embodiment, the resonance frequency is greater than about 300 hertz. Other frequencies may be utilized to achieve a desirable combination of noise and air pressure. The oscillation of diaphragm 106 may produce airflow 118 into and then out of central opening 104. In another embodiment, a housing (not shown) may direct airflow in and/or out from a single side of piezoelectric air jet 100. In one embodiment, diaphragm 106 may have two opposing layers that bring air in between them and then force air out. Other embodiments of diaphragm 106 will occur to those skilled in the art and fall within the scope of the present invention.

Figure 2:
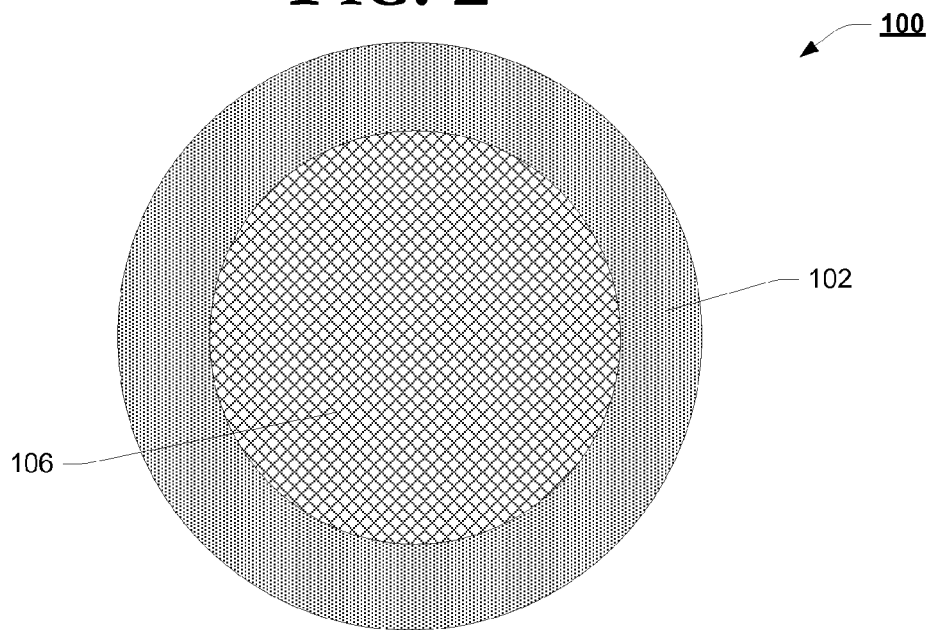
FIG. 2 is a graphical illustration of an overhead view of the piezoelectric air jet depicted in FIG. 1, in accordance with one example embodiment of the invention.

FIG. 2 is a graphical illustration of an overhead view of the piezoelectric air jet depicted in FIG. 1, in accordance with one example embodiment of the invention. In accordance with one example embodiment, piezoelectric air jet 100 includes one or more of multi-layer piezoelectric stack 102 and diaphragm 106. While shown as being circular in shape, piezoelectric air jet 100 may comprise any of a variety of shapes. In one embodiment, piezoelectric air jet 100 is oval in shape. Also, while shown as being continuous, multi-layer piezoelectric stack 102 and/or diaphragm 106 may be discontinuous or segmented.

Figure 3:
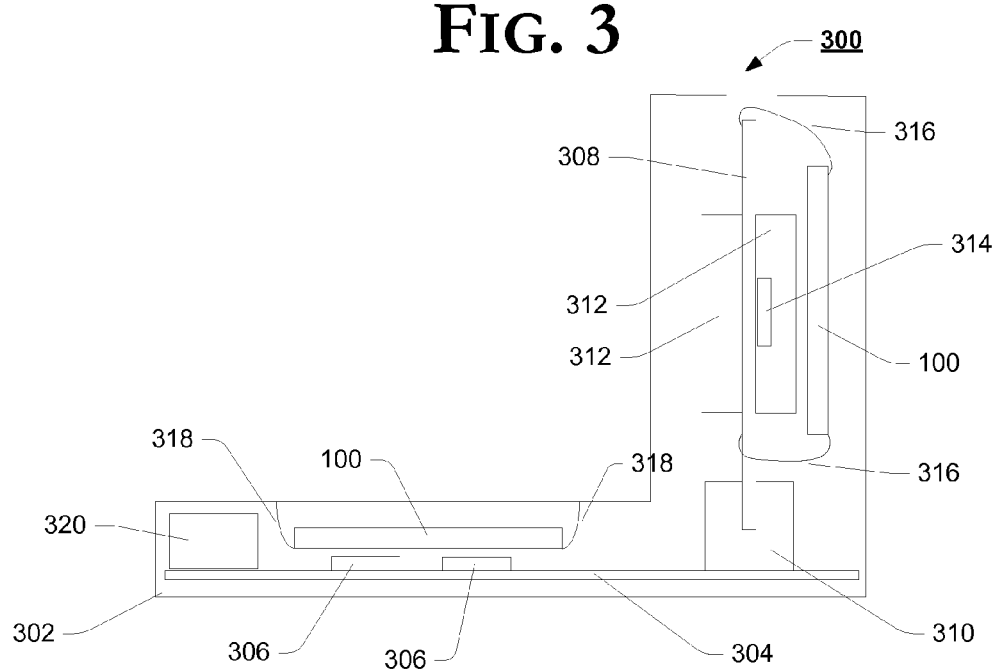
FIG. 3 is a graphical illustration of a cross-sectional view of an example implementation of piezoelectric air jet augmented cooling for electronic devices, in accordance with one example embodiment of the invention.

FIG. 3 is a graphical illustration of a cross-sectional view of an example implementation of piezoelectric air jet augmented cooling for electronic devices, in accordance with one example embodiment of the invention. As shown, computing device 300 includes chassis 302, printed circuit board 304, integrated circuit devices 306, memory module 308, connector 310, memory devices 312, advanced memory buffer 314, clips 316, clips 318 and power source 320, which provides power for the electric components of computing device 300 and may include a battery or power supply. Computing device 300 may include multiple piezoelectric air jets 100, for example to blow air on integrated circuit devices 306 and to blow air on advanced memory buffer 314 of memory module 308.

Chassis 302 may provide mechanical strength and stability to computing device 300 and to house the other components of computing device 300. Printed circuit board 302 may include electronic components, wires, traces and connectors, which aren't all shown for ease of understanding. Integrated circuit devices 306 may include memory devices, controllers, processors and the like. In one embodiment, due to a lack of space between chassis 302 and integrated circuit devices 306, piezoelectric air jet 100 is attached to chassis 302 via clips 318 and positioned adjacent to integrated circuit devices. Although shown as attached using clips 318, other means of attachment are possible and would not be outside the scope of the present invention.

Computing device 300 may also include memory module 308, which is coupled with printed circuit board 304 through connector 310. Memory module 308 may comprise a fully buffered dual inline memory module (FB-DIMM), including memory devices 312 and advanced memory buffer 314. Advanced memory buffer 314 may experience higher temperatures than memory devices 312 and may particularly benefit from the teaching of the present invention. In one embodiment, piezoelectric air jet 100 is coupled with memory module 308 through clips 316 and positioned adjacent to the advanced memory buffer 314 to provide a jet of air. In another embodiment, piezoelectric air jet 100 is positioned between adjacent memory modules 308.

Figure 4:
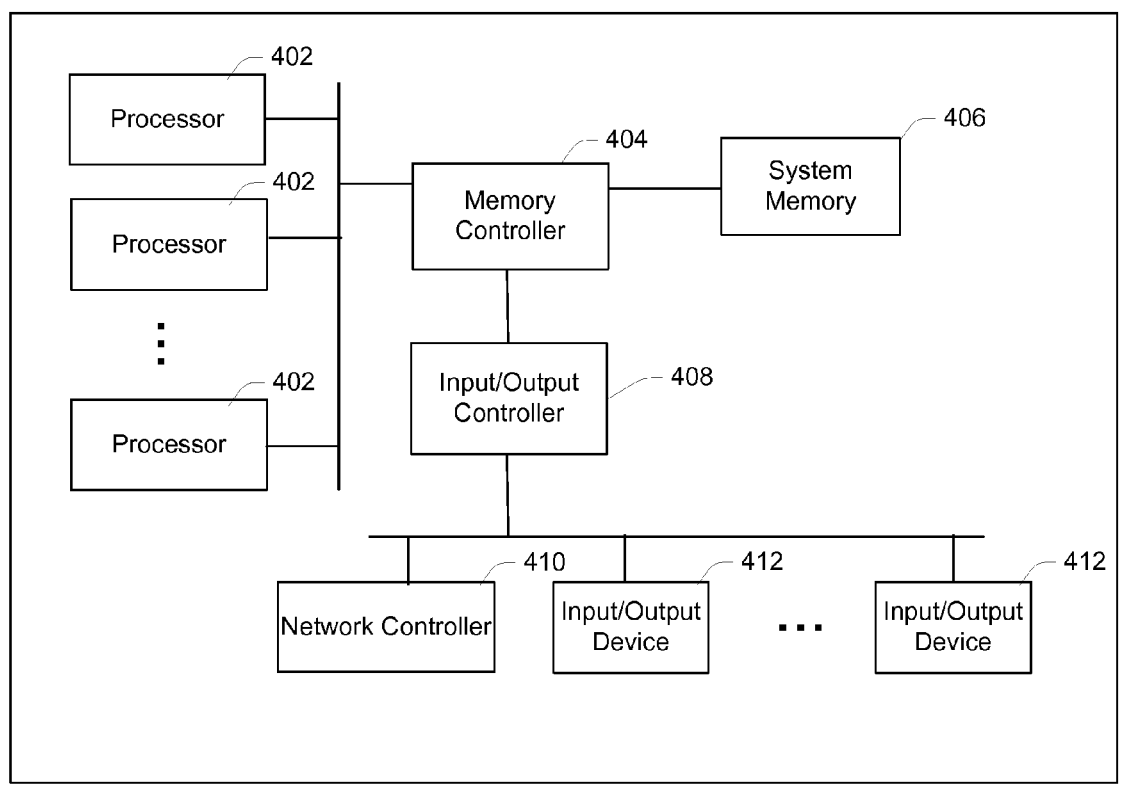
FIG. 4 is a block diagram of an example electronic appliance suitable for implementing piezoelectric air jet augmented cooling, in accordance with one example embodiment of the invention.

FIG. 4 is a block diagram of an example electronic appliance suitable for implementing piezoelectric air jet augmented cooling, in accordance with one example embodiment of the invention. Electronic appliance 400 is intended to represent any of a wide variety of traditional and non-traditional electronic appliances, laptops, cell phones, wireless communication subscriber units, personal digital assistants, or any electric appliance that would benefit from the teachings of the present invention. In accordance with the illustrated example embodiment, electronic appliance 400 may include one or more of processor(s) 402, memory controller 404, system memory 406, input/output controller 408, network controller 410, and input/output device(s) 412 coupled as shown in FIG. 4. Electronic appliance 400 may include one or more piezoelectric air jet(s) 100 to blow air on a particular integrated circuit device(s) or to circulate air in general.

Processor(s) 402 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, processors(s) 402 are Intel® compatible processors. Processor(s) 402 may have an instruction set containing a plurality of machine level instructions that may be invoked, for example by an application or operating system.

Memory controller 404 may represent any type of chipset or control logic that interfaces system memory 406 with the other components of electronic appliance 400. In one embodiment, the connection between processor(s) 402 and memory controller 404 may be a point-to-point serial link. In another embodiment, memory controller 404 may be referred to as a north bridge.

System memory 406 may represent any type of memory device(s) used to store data and instructions that may have been or will be used by processor(s) 402. Typically, though the invention is not limited in this respect, system memory 406 will consist of dynamic random access memory (DRAM). In one embodiment, system memory 406 may consist of Rambus DRAM (RDRAM). In another embodiment, system memory 406 may consist of double data rate synchronous DRAM (DDRSDRAM).

Input/output (I/O) controller 408 may represent any type of chipset or control logic that interfaces I/O device(s) 412 with the other components of electronic appliance 400. In one embodiment, I/O controller 408 may be referred to as a south bridge. In another embodiment, I/O controller 408 may comply with the Peripheral Component Interconnect (PCI) Express™ Base Specification, Revision 1.0a, PCI Special Interest Group, released Apr. 15, 2003.

Network controller 410 may represent any type of device that allows electronic appliance 400 to communicate with other electronic appliances or devices. In one embodiment, network controller 410 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 410 may be an Ethernet network interface card.

Input/output (I/O) device(s) 412 may represent any type of device, peripheral or component that provides input to or processes output from electronic appliance 400.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. An apparatus comprising:
    a plurality of multi layered lead-free piezoelectric layers and electrodes stacked on top of each other and formed around a central opening; and
    a diaphragm coupled to the piezoelectric layers and substantially covering the central opening to vibrate and blow air when an operating voltage is applied to the electrodes.

2. The apparatus of claim 1, wherein the lead-free piezoelectric layers comprise $BaTiO_3$.

3. The apparatus of claim 2, wherein the electrodes comprise nickel.

4. The apparatus of claim 1, wherein each piezoelectric layer comprises a thickness of less than about 4 micrometers.

5. The apparatus of claim 1, wherein the operating voltage comprises less than about 5 volts.

6. The apparatus of claim 1, further comprising an electronic device adjacent to the diaphragm to receive a jet of air.

7. The apparatus of claim 6, wherein the electronic device comprises an advanced memory buffer (AMB) of a fully buffered DIMM (FB-DIMM).

8. An electronic appliance comprising:
    a network controller;
    a system memory;

a processor; and a piezoelectric air jet, the piezoelectric air jet comprising a plurality of lead-free piezoelectric layers and electrodes stacked on top of each other and formed around a central opening, and a diaphragm coupled to the piezoelectric layers and substantially covering the central opening to vibrate and blow air when an operating voltage of less than about 5 volts is applied to the electrodes.

9. The electronic appliance of claim 8, wherein the lead-free piezoelectric layers comprise $BaTiO_3$.

10. The electronic appliance of claim 9, wherein the electrodes comprise nickel.

11. The electronic appliance of claim 8, wherein each piezoelectric layer comprises a thickness of less than about 4 micrometers.

12. The electronic appliance of claim 8, further comprising the piezoelectric air jet coupled with a module of the system memory.

13. The electronic appliance of claim 12, wherein the piezoelectric air jet is configured to blow air onto an advanced memory buffer of the memory module.

14. An apparatus comprising:

a plurality of integrated circuit device(s);

a power source to power the integrated circuit device(s);

a chassis to house the integrated circuit device(s) and the power source; and a piezoelectric blower having a thickness of less than about 1.5 mm positioned between at least one of the integrated circuit devices and the chassis to blow air onto the at least one of the integrated circuit devices, the piezoelectric blower comprising more than about 100 layers of $BaTiO_3$ and nickel stacked together and shaped around a central opening, the central opening substantially covered by a flexible diaphragm.

15. The apparatus of claim 14, wherein each piezoelectric layer comprises a thickness of less than about 4 micrometers.

16. The apparatus of claim 14, wherein the piezoelectric blower further comprises an operating voltage of less than about 5 volts.

17. The apparatus of claim 14, wherein the piezoelectric blower comprises a circular shape.

18. The apparatus of claim 14, wherein the piezoelectric blower comprises an oval shape.

19. The apparatus of claim 14, wherein the piezoelectric blower comprises a resonance frequency of greater than about 300 hertz.

* * * * *